United States Patent [19]

Sager et al.

[11] Patent Number: 5,264,810
[45] Date of Patent: Nov. 23, 1993

[54] SIGNAL POWER COMBINER AND DIVIDER

[75] Inventors: Henry L. Sager, Allen; Philip A. Mayer, Garland, both of Tex.

[73] Assignee: Rockwell International Corporation, Seal Beach, Calif.

[21] Appl. No.: 962,440

[22] Filed: Oct. 16, 1992

[51] Int. Cl.⁵ ............................................. H03H 7/48
[52] U.S. Cl. ................................ 333/131; 440/124 R; 440/124 D; 440/295
[58] Field of Search .......................... 333/119, 131; 330/124 R, 124 D, 147, 148, 195, 295

[56] References Cited

U.S. PATENT DOCUMENTS 2,788,495  4/1957  Hylas et al. ................... 333/131 X
3,406,352  10/1968  Gardenghi .................... 330/195 X

FOREIGN PATENT DOCUMENTS 593051  2/1934  Fed. Rep. of Germany ...... 333/119

OTHER PUBLICATIONS

H. O. Granberg, "Broadband Transformers and Power Combining Techniques for RF", pp. 2-51 thru 2-59 Motorola RF Data Manual, 1st Edition, Motorola, Inc. 1978, USA.

H. O. Granberg, "A Two-Stage 1 KW Solid-State Linear Amplifier", pp. 4-31 thru 4-41, Motorola RF Data Manual, 1st Ed., Motorola, Inc., 1978, USA.

Primary Examiner—Paul Gensler
Attorney, Agent, or Firm—V. Lawrence Sewell; H. Frederick Hamann

[57] ABSTRACT

A circuit for combining electronic signal power from multiple input ports to a single set of output terminals or for dividing a single signal at a set of input terminals and providing it to multiple output ports. The circuit has a three-winding transformer and a balance resistor or resistors corresponding to each of the multiple ports. Each port is connected to a first winding of its corresponding transformer. The second windings of the transformers are connected together and to the single set of terminals. Third windings of the transformers are connected together through their corresponding balance resistors.

10 Claims, 3 Drawing Sheets

SIGNAL POWER COMBINER AND DIVIDER

BACKGROUND OF THE INVENTION

1. Field of the Invention

This invention relates to a circuit for combining electronic signal power from multiple sources such as amplifiers or for dividing a single signal and providing it to multiple loads, such as amplifier inputs. The invention has particular applicability to radio frequency (RF) power circuits.

2. Description of the Related Art

The present invention arose in the field of RF transmission, where power requirements may exceed practical levels for a single amplifier, making it desirable to amplify a signal with multiple RF power amplifiers in parallel. An input power divider circuit is used to divide the signal and provide it to the inputs of the multiple amplifiers, while an output combiner provides the combined outputs of the multiple amplifiers to the next stage load. The present invention is an improved circuit that will be discussed mainly as an output combiner, for simplicity, but which can also be arranged as an input divider, as will be shown.

An important attribute of an output combiner is its capability to provide the correct load impedance to the outputs of the amplifiers (connected to its input ports), when the combiner is terminated in its actual load impedance. That is, the input impedance of the combiner, when it is terminated in the actual load impedance, should be that known impedance which allows the amplifier to deliver full rated power.

A second attribute of a combiner is its ability to provide isolation between the outputs of the amplifiers connected to its input ports, preventing power from one amplifier from being reflected back into another amplifier.

A third important attribute of a combiner is its ability to maintain the correct impedance and isolation if there is a failure or removal of one or more of the amplifiers connected to it. That is, the impedance presented to the operative amplifiers should continue to be the correct value, and the amplifiers should continue to be isolated from each other.

Combiner designs vary in their abilities to provide the above attributes, particularly in their responses to amplifier failures.

Two conventional combiner designs are shown in the *Motorola RF Data Manual*, first edition, Motorola, Inc. 1978, in a first article entitled "Broadband Transformers and Power Combining Techniques for RF", beginning at page 2-51 and a second article entitled "A Two-Stage 1KW Solid-State Linear Amplifier", beginning at page 4-31, both prepared by H. O. Granberg. These designs are discussed in more detail in a following section of this application, in connection with figures, so that they may be clearly contrasted with the present invention.

The combiner described in the first article provides good isolation between amplifiers and maintains correct load impedance if one or more amplifiers become inoperative. However, this design has some disadvantages: (a) it can only be used to combine a number of amplifiers which is a power of two, (b) the transformers in this design are arranged in stages and must be able to handle larger power levels, the closer their stage is to the output of the combiner, and (c) the design requires a final and, often, intermediate transformer solely for the purpose of stepping back up to the proper impedance level.

The design of the second article reference above overcomes disadvantages (a) and (b) of the first conventional design, but not (c). In addition, it has a balance resistor that can only be optimized for a predefined number of failed amplifiers. For other than the predefined number, the balance resistor is not optimum and results in an incorrect impedance being presented to the amplifiers and reduced isolation between the remaining active amplifiers.

Another aspect of combiner performance is the maximization of power flow through the combiner in case there is a failure of one of the amplifiers connected to it. Even when the combiner maintains good isolation and continues to present the correct impedance to the operative amplifiers after the failure, the absence of an amplifier generally causes operation in which significant power is dissipated in balancing resistors within the combiner. In the conventional designs, there are not straightforward adjustments that will permit the combiner to pass through to its load all the power received from the operative amplifiers. Instead, these designs would require extensive circuit reconfiguration and/or a change in the value of one or more balancing resistors.

SUMMARY OF THE INVENTION

The present invention is a circuit which can be used as a combiner or divider. For the combiner, for example, there is a three winding transformer for each amplifier, with each amplifier output connected to the first winding of a different one of the transformers. The second winding of the transformers are connected together and to the load. The third windings are connected together through balancing resistors.

The present invention offers advantages in comparison to the conventional designs described above. The circuit of the invention can be used for any number of amplifiers. This circuit is only one stage deep, so there is not a requirement for transformers of progressively larger power capacity. Neither is there a requirement for additional output transformers just to adjust the impedance.

The combiner of the present invention provides the correct impedance to the amplifiers which are connected to its input ports, when the combiner is terminated in its load. Additionally, the combiner provides good isolation between the amplifiers.

It is a feature of the present invention, that it continues to present the correct impedance to the amplifiers at its inputs and maintains isolation between them, despite the failure of any number of combination of amplifiers, or their removal.

It is a major advantage of the present invention compared to any conventional combiner of which we are aware that if an input amplifier fails, steps can be taken to assure that the power from the operative amplifiers will be transferred to the load, rather than being dissipated in the combiner.

The combiner of the invention offers a further advantage compared to the conventional designs described in the referenced articles, in that it can be integrated into the output sections of amplifiers, thereby achieving a parts savings.

DESCRIPTION OF THE PREFERRED EMBODIMENTS

Before describing a specific embodiment of the invention, reference will be made to two figures showing conventional combiner designs for comparison with the present invention. These conventional designs are the same or almost the same as those described in the two articles referenced above; however, the circuits in the articles are drawn differently and may require some interpretation for comparison with the figures showing the invention in this application.

Figure 1:
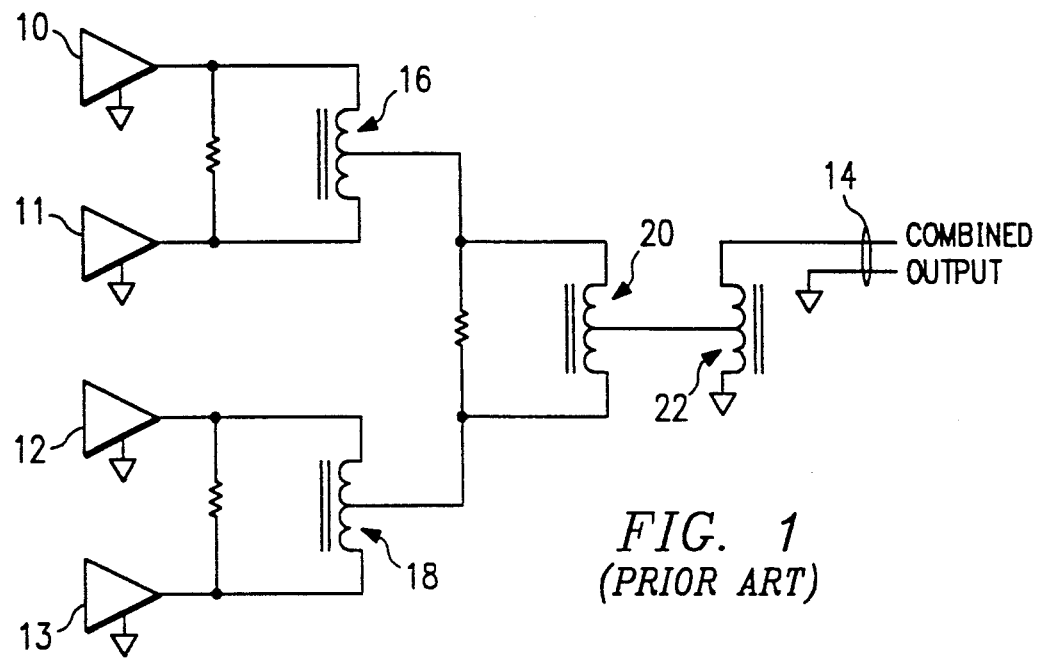
FIG. 1 is a schematic diagram of a first prior art combiner.

FIG. 1 shows a combiner circuit which receives the outputs of amplifiers 10–13 and provides a combination of their outputs at terminals 14 for provision to a load, not shown. The combiner has transformers 16 and 18 in a first stage connected to the amplifiers and then a transformer 20 in the next stage, connected to transformers 16 and 18. If there were eight amplifiers in the first stage, instead of the four shown, then there would need to be another second stage transformer like transformer 20 and a third stage transformer connected to the second stage transformers. The design of FIG. 1 has the following disadvantages. It can only be used for a number of amplifiers which is equal to a power of two. In addition, the power handling capacity of the transformer 20 must be larger than that of transformer 16 and 18, and in general the power handling capability of the transformers must grow, the closer they are to the output of the combiner. Finally, the transformers 16, 18 and 20 do not provide the correct impedance to the amplifiers 10–13, so there is the necessity for an additional transformer 22 just to achieve the proper impedance.

Figure 2:
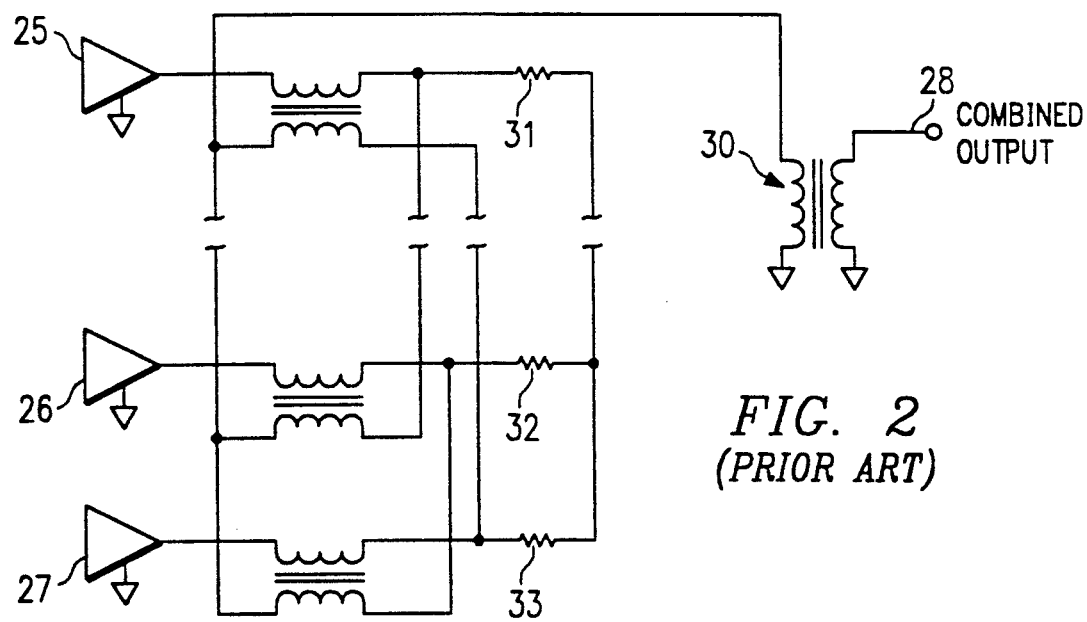
FIG. 2 is a schematic diagram of a second prior art combiner.

In the conventional design of FIG. 2, a combiner receives the outputs of amplifiers 25, 26 and 27 and provides their combined outputs at terminals 28 for a load not shown. This design avoids two of the disadvantages of the circuit of FIG. 1. It can be used for any number of amplifiers. In addition, it is not a staged design, so there is not a requirement for transformers of progressively increasing power handling capacity.

Like the circuit of FIG. 1, however, the circuit of FIG. 2 requires a transformer 30 just to provide the correct impedance to amplifiers 25–27. Further, the circuit of FIG. 2 has balance resistors 31, 32 and 33, having the same value of resistance, which can only be optimized to provide for a predefined number of failed amplifiers. For a number of inactive amplifiers other than that predefined number, the resistance of resistors 31–33 is not optimum and results in an incorrect load impedance for amplifiers 25–27 and reduced isolation for those amplifiers which remain active.

Figure 3:
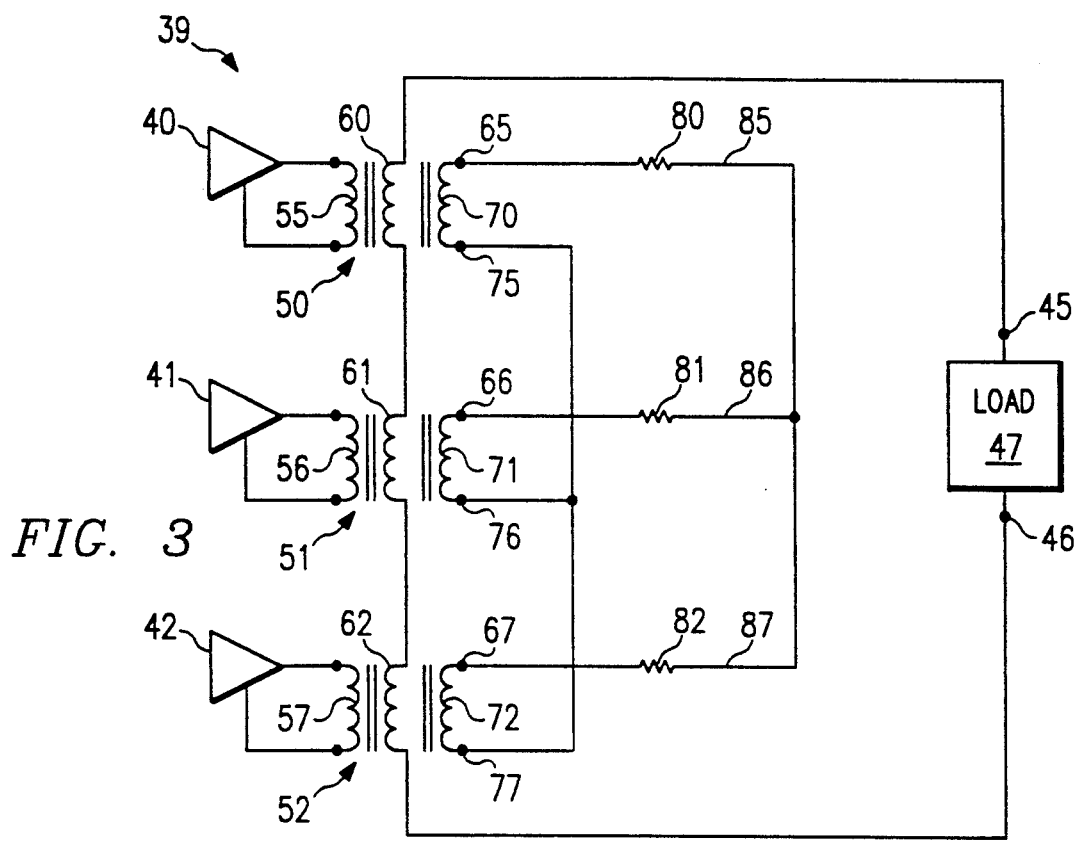
FIG. 3 is a schematic diagram of a combiner circuit in accordance with the invention.

A combiner circuit 39 according to the present invention is shown in FIG. 3. It is shown receiving the outputs of amplifiers 40, 41 and 42 and providing a combination of these outputs at a set of terminals 45 and 46 to a load 47. Each of the amplifiers 40–42 has associated with it a different one of the transformers 50–52. The transformers 50–52 have first windings 55–57, second windings 60–62, and third windings 70–72, respectively. The output of each amplifier is connected across the first winding of its associated transformer. Thus, the terminals of the first windings 55–57 form multiple input ports to the combiner, each of which receives the output signal of one of the amplifiers 40–42.

Second windings 60–62 of the transformers 50–52 are connected to each other in series and across the load 47. The third windings 70–72 of the transformers each have one of their terminals 75–77 connected together. At the other terminals 65–67 of the third windings, are resistors 80–82, which also have one of their terminals 85–87 connected together. Thus, the third windings 70–72 are connected together through resistors 80–82 in a parallel arrangement.

Values for the circuit components of FIG. 3 are assigned so that the combiner 39, when loaded with load 47, presents a selected impedance to amplifiers 40–42. It will be assumed that the output signals of amplifiers 40–42 are substantially the same and that the amplifiers all require substantially the same load impedance, as would ordinarily be the case in a design of this type. As a result, transformers 50–52 will have the same turns ratios, and resistors 80–82 will be of the same value.

The number of amplifiers 40–42, which is the same as the number of transformers 50–52 and resistors 80–82, is represented by $N_A$. While any number of amplifiers can be used, in the embodiment of FIG. 3, $N_A$ is equal to 3. The impedance of the load 47 is represented by $Z_L$.

The impedance of each of the transformer second windings 60–62 is represented by Z2. The load impedance is divided by the number of input ports, so Z2 should be equal to $Z_L/N_A$. For example, for FIG. 3, if $Z_L$ is 50 Ohms, then Z2 should be 16.7 Ohms.

The turns ratio of each of the first windings 55–57 to the corresponding one of the second windings 60–62 is represented by N1:N2 or N1/N2. This turns ratio transfers the impedance Z2 of each second winding to the impedance of its first winding Z1, according to the formula $N1/N2 = (Z1/Z2)^{\frac{1}{2}}$. The first winding impedance Z1 should be the same as the correct load impedance $Z_A$ to be presented to each of the amplifiers 40–42. Making substitution of $Z_A$ for Z1 and $Z_L/N_A$ for Z2 in the preceding equation, it turns out that the turns ratio N1:N2 should be made equal to $(N_A Z_A/Z_L)^{\frac{1}{2}}$.

Continuing the example wherein $Z_L$ is 50 Ohms, if $Z_A$ is also 50 Ohms, then N1:N2 is equal to $N_A^{\frac{1}{2}}$, and for $N_A$ equal to 3, N1:N2 is equal to 1.73.

The impedance Z3 of each of third windings 70–72 should be set to the resistance value R of each of the resistors 80–82. The value of R is independently selectable. The turns ratio between each of the second windings 60–62 and the corresponding one of the third windings 70–72 is represented by N2:N3 or N2/N3, which is related to the impedances by $N2/N3 = (Z2/Z3)^{\frac{1}{2}}$. Substituting R for Z3 and $Z_L/N_A$ for Z2 in the latter equation, it is found that the turns ratio N2:N3 should be made equal to $(Z_L/(N_A R))^{\frac{1}{2}}$.

If R is 50 Ohms, then N2:N3 should be $(1/N_A)^{\frac{1}{2}}$. For $N_A$ equal to 3, N2:N3 would be 0.58, and N3/N2 or N3:N2 should be 1.73.

In operation, with all of the amplifier output signals present and equal, there is no voltage developed across the balance resistors 80–82. Additionally, the impedance presented to each of the amplifiers 40–42 by the input ports of combiner 39 (the terminals of first windings 55–57) is the correct load impedance for the amplifiers. If an input to the combiner from one or more amplifiers should fail, then voltage is developed across the balance resistors 80-82. This results in reflecting an additional load impedance to the operative input ports that compensates for the decreased input impedance of the combiner due to inoperative amplifiers. Thus, the operative amplifiers do not see a change in the input impedance of the combiner as a result of other amplifier outputs failing.

In addition, the voltage developed across the balance resistors results in a current flow in those of the transformer third windings 70-72 which are connected to inoperative amplifiers, which current opposes the second winding series current from the transformers having operative amplifiers. This results in zero voltage and current at the combiner inputs associated with inoperative amplifiers. Accordingly, the output of a failed amplifier could appear as a short, open, or any impedance, while maintaining isolation with respect to the other amplifiers.

The combiner 39 of FIG. 3 also permits a practical adjustment, when one of the amplifiers 40-42 fails or is removed, that allows all the power from the operative amplifiers to be provided to load 47. In previous types of combiners, it was not practical to change the number of amplifiers, without either dissipating power in the balance resistors, or extensive circuit reconfiguration, and/or a change in the values of the balance resistors. With the present invention, if an amplifier fails or is removed, the second winding terminals of the transformer associated with the inoperative or removed amplifier are shorted, and the balance resistor associated with that amplifier is disconnected. Then, the load impedance can be altered to get the full output from the remaining amplifiers. Alternatively, the transformers 50-52 may be provided with taps on windings 60-62, so that different turns ratios can be selected after amplifier failures. With conventional combiners, there is no practical way to remove amplifiers and adjust the load or turns ratio to deliver all the power from the remaining amplifiers to the load.

An additional advantage of the combiner according to the invention is that the inputs to the combiner may be floating or grounded at either end, or the input windings 55-57 may be grounded at a center tap. Additionally, terminal 86 or terminal 77 could be grounded. The output of the combiner could be floating as shown (the set of terminals 45 and 46), or grounded or balanced.

In a minor variation of the circuit arrangement of FIG. 3, the balance resistance associated with each of the third windings is split between two resistors connected to the two terminals of each third winding. The resistors for one set of three third winding terminals are connected together in the way that resistors 80-82 of FIG. 3 are connected at terminals 85-87. The resistors for the other set of three third winding terminals are connected together in the same way.

Figure 4:
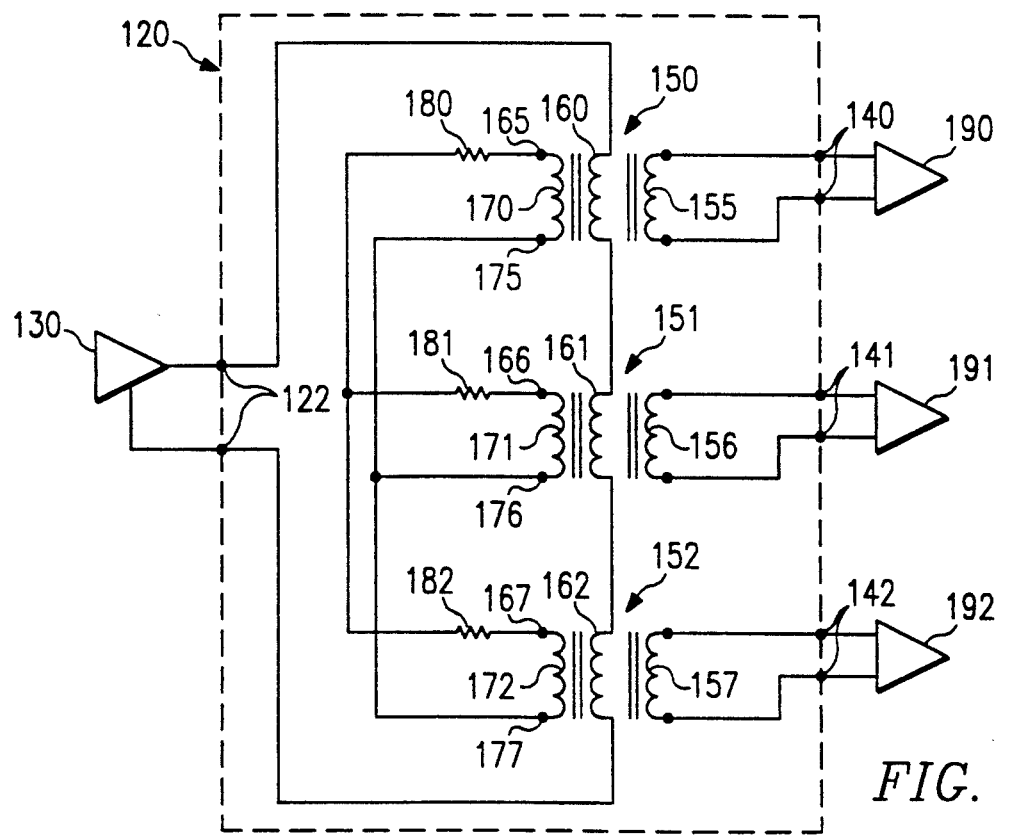
FIG. 4 is a schematic diagram of a divider circuit in accordance with the invention.

FIG. 4 illustrates a divider according to the invention, indicated generally by reference numeral 120. A set of input terminals 122 receives a signal input to the divider, and provides the signal, divided with respect to power, at output ports 140-142. As with the previously described combiner of FIG. 3, divider 120 has three-winding transformers 150-152. Each of ports 140-142 is connected to the terminals of first windings 155-157, respectively, of transformers 150-152. Second windings 160-162 of the transformers are connected together is series and across the input set of terminals 122. Third windings 170-172 of transformers 150-152 each have a terminal, numbered 175-177, connected together. The other terminals 165-167 of third windings 170-172 are each connected to a terminal of one of the balance resistors 180-182. The other terminals of the balance resistors are connected together, so that terminals 165-167 of the third windings are connected together through the balance resistors.

Values for the circuit components of FIG. 4 are computed with essentially the same formulas as those for FIG. 3. These formulas will be restated, using $Z_o$ as the load impedance to be presented by the divider 120 to the preceding stage 130 connected to the set of input terminals 122 of the divider. The variable $Z_I$ will be used to represent the input impedance of each of the following stages 190-192 connected to the output ports 140-142 of the divider. The number of output ports 140-142 will be represented by $N_A$. The resistance value of balance resistors 180-182 will be represented by R.

Accordingly, the ratio of turns in first transformer windings 155-157 to corresponding second windings 160-162, represented by N1N2, should be made equal to $(N_A Z_I/Z_o)^{\frac{1}{2}}$. The ratio of the turns of second windings 160-162 to their corresponding third windings 170-172, represented by N2:N3, should be made equal to $(Z_o/(N_A R))^{\frac{1}{2}}$.

Figure 5:
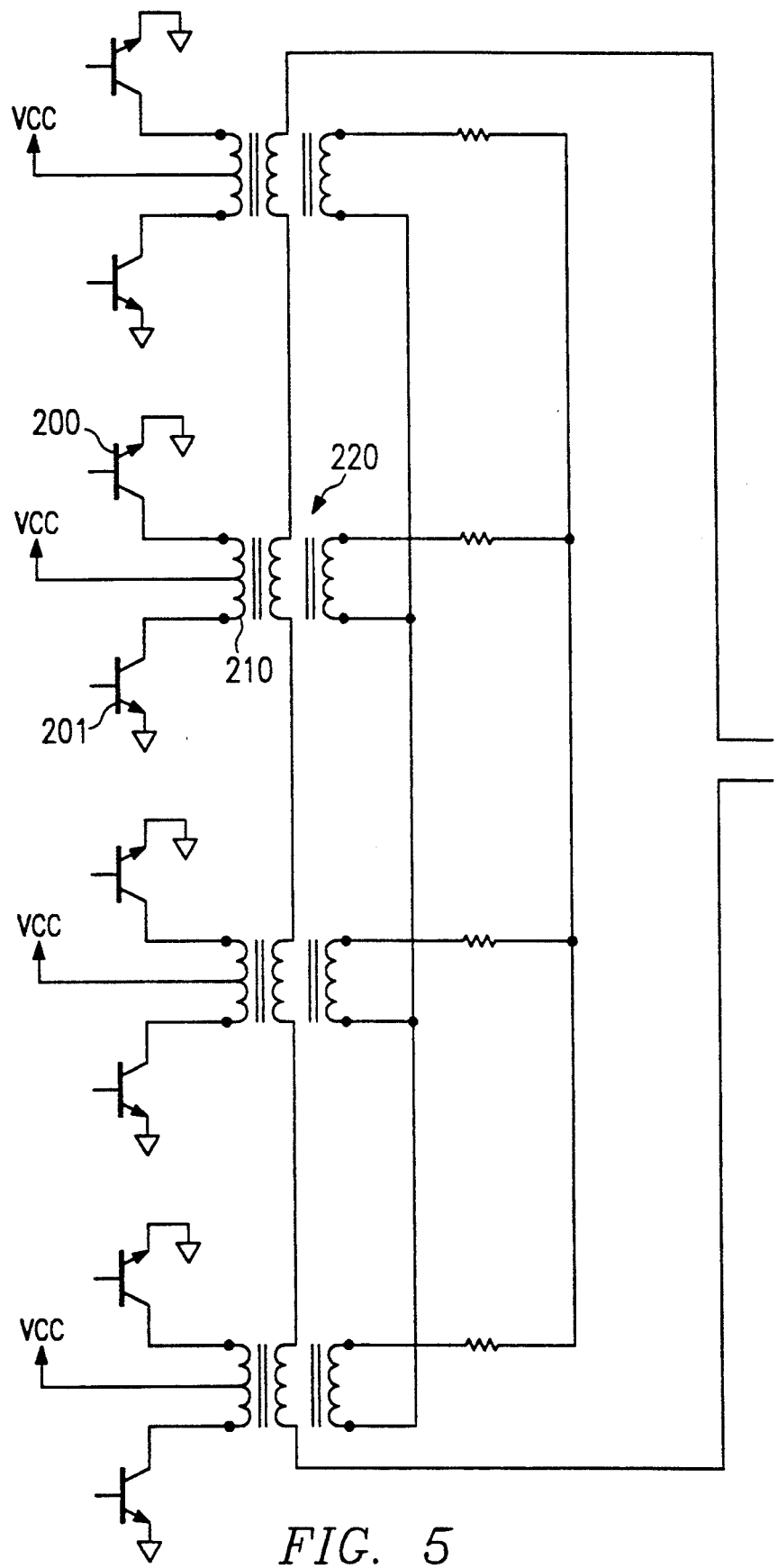
FIG. 5 is a schematic diagram illustrating how a combiner circuit of the invention may be integrated into the output of associated amplifiers.

Whereas conventional combiners do not lend themselves to direct incorporation in the outputs of amplifiers, a combiner according to the present invention can be, as illustrated in FIG. 5. As seen in FIG. 5, amplifier output transistors, such as transistors 200 and 201, are connected to the terminals of a first winding 210 of a three-winding transformer 220. First winding 210 is also connected at a mid point to a DC voltage VCC supplying the transistors 200 and 201. The structure of the combiner of FIG. 5 is shown to be the same as that of FIG. 3. The combiner transformers take the place of amplifier output transformers, thereby achieving a parts saving compared with the use of separate amplifiers and combiner.

The inventive concept, described in detail above, can thus be embodied in either a combiner or a divider, with a number of advantages. Although preferred embodiments of the invention have been described, it is to be understood that various changes, substitutions and alterations can be made without departing from the spirit and scope of the invention as defined by the appended claims.

We claim:

1. A circuit capable of combining signals at multiple ports, $N_A$ in number, and providing the combined signals at a single set of terminals, or dividing a signal at the single set of terminals and providing divided signals to each of the multiple ports, comprising:

a number $N_A$ of transformers, each having first, second and third windings;

means for connecting each of the multiple ports to a different one of the first windings;

means for interconnecting said second windings and connecting the second windings to the single set of terminals; and means, including a number $N_A$ of resistors, for connecting the third windings together, each through a different one of said resistors.

2. The circuit of claim 1, wherein the means for connecting the third windings includes means for connecting the third windings in a parallel arrangement.

3. The circuit of claim 2, configured for said dividing a signal, from said set of terminals as an input to said multiple ports as outputs, wherein
said means for interconnecting the second windings includes means for connecting the second windings in series and to the input set of terminals, and
said means for connecting the third windings together includes means for connecting one terminal of each of the third windings together and means for connecting each of the other terminals of the third windings
through a different one of the resistors to a common point.

4. The circuit of claim 3, with values calculated for dividing a signal from a preceding stage to multiple following stages and presenting to the preceding stage a load impedance $Z_O$, with each of the following stages having an input impedance of $Z_I$, the turns ratios of the first, second and third transformer windings being represented by N1:N2:N3, the resistors each having a resistance R, and wherein
the ratio N1:N2 is substantially $(N_A Z_I / Z_O)^{\frac{1}{2}}$, and
the ratio N2:N3 is substantially $(Z_O / (N_A R))^{\frac{1}{2}}$.

5. The circuit of claim 2, configured for said dividing a signal, from said set of terminals as an input to said multiple ports as outputs, wherein
said means for interconnecting the second windings includes means for connecting the second windings in series and to the input set of terminals, and
said means for connecting the third windings together includes
means for connecting a first terminal of each of the third windings together through a different one of the resistors to a first common point and
means, including additional resistors, $N_A$ in number, for connecting a second terminal of each of the third windings together through a different one of said additional resistors to a second common point.

6. The circuit of claim 5, with values calculated for dividing a signal from a preceding stage to multiple following stages and presenting to the preceding stage a load impedance $Z_O$, with each of the following stages having an input impedance of $Z_I$, the turns ratios of the first, second and third transformer windings being represented by N1:N2:N3, the sum of the resistances of the two resistors connected to each of the third windings being represented by R, and wherein
the ratio N1:N2 is substantially $(N_A Z_I / Z_O)^{\frac{1}{2}}$, and
the ratio N2:N3 is substantially $(Z_O / (N_A R))^{\frac{1}{2}}$.

7. The circuit of claim 2, configured for said combining signals at multiple ports, as inputs, and providing the combined signals at said single set of terminals, as an output connected to a load, wherein
said means for interconnecting the second winding includes means for connecting the second windings in series and to the load, and
said means for connecting the third windings together includes
means for connecting a first terminal of each of the third windings together through a different one of the resistors to a first common point and
means, including additional resistors, $N_A$ in number, for connecting a second terminal of each of the third windings together through a different one of said additional resistors to a second common point.

8. The circuit of claim 7, with values calculated for combining signals at multiple input ports and providing the combined signals to a load with input impedance $Z_L$, while presenting to each of the ports a load impendance of $Z_A$, the turns ratios of the first, second and third transformer windings being represented by N1:N2:N3, the sum of the resistances of the two resistors connected to each of the third windings being represented by R, and wherein
the ratio N1:N2 is substantially $(N_A Z_A / Z_L)^{\frac{1}{2}}$, and
the ratio N2:N3 is substantially $(Z_L / (N_A R))^{\frac{1}{2}}$.

9. A circuit for combining the signals at the outputs of multiple amplifiers, $N_A$ in number, and providing the combined signals to a load, comprising:
a number $N_A$ of resistors and
a number $N_A$ of transformers, each having first, second and third windings, with
each of the amplifier outputs being connected to a different one of the first windings,
the second windings being connected in series and to the load,
one terminal of each of the third windings being connected together, and
each of the other terminals of the third windings being connected through a different one of the resistors to a common point.

10. A circuit for combining the signals at the outputs of multiple amplifiers, $N_A$ in number, and for providing the combined signals to a load with input impedance $Z_L$, while presenting to each of the amplifiers a load impedance $Z_A$, the circuit comprising:
a number $N_A$ of resistors, each having resistance R and
a number $N_A$ of transformers, each having first, second and third windings, with the ratios of the number of turns in the first, second and third windings being represented by N1:N2:N3, and with
each of the amplifier outputs being connected to a different one of the first windings,
the second windings being connected in series and across the load,
one terminal of each of the third windings being connected together, with the connected terminals being those of the same signal polarity referenced to the outputs of the amplifiers, and
each of the other terminals of the third windings being connected through a different one of the resistors to a common point, with the ratio N1:N2 being substantially $(N_A Z_A / Z_L)^{\frac{1}{2}}$ and the ratio N2:N3 being substantially $(Z_L / (N_A R))^{\frac{1}{2}}$.

* * * * *